United States Patent
Kim et al.

(10) Patent No.: US 8,201,616 B2
(45) Date of Patent: Jun. 19, 2012

(54) INSTALLATION FINS AND INSTALLATION STRUCTURE OF FINS AND A HEAT SINK WITH MOVING FINS INSERTED BETWEEN COOLING FINS

(75) Inventors: Dong Kwon Kim, Yuseong-gu (KR);
Tae Young Kim, Yuseong-gu (KR);
Sung Jin Kim, Yuseong-gu (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 679 days.

(21) Appl. No.: 12/294,104

(22) PCT Filed: Aug. 4, 2007

(86) PCT No.: PCT/KR2007/003761
§ 371 (c)(1),
(2), (4) Date: Sep. 23, 2008

(87) PCT Pub. No.: WO2008/018723
PCT Pub. Date: Feb. 14, 2008

(65) Prior Publication Data
US 2009/0205807 A1    Aug. 20, 2009

(30) Foreign Application Priority Data
Aug. 10, 2006 (KR) .......... 10-2006-0075721

(51) Int. Cl.
*H05K 7/20* (2006.01)
*F28F 5/00* (2006.01)

(52) U.S. Cl. ......... 165/80.3; 165/86; 165/94; 165/109.1
(58) Field of Classification Search ............... 165/86, 165/80.3, 94; 361/704
See application file for complete search history.

(56) References Cited

U.S. PATENT DOCUMENTS

| | | | | |
|---|---|---|---|---|
| 2,834,582 A | * | 5/1958 | Kablitz | 165/185 |
| 3,844,341 A | * | 10/1974 | Bimshas et al. | 165/86 |
| 5,000,254 A | * | 3/1991 | Williams | 165/85 |
| 5,385,645 A | * | 1/1995 | Li | 165/94 |
| 5,513,698 A | * | 5/1996 | O'Hanlon | 165/94 |
| 5,946,190 A | | 8/1999 | Patel et al. | |
| 5,971,061 A | * | 10/1999 | Li | 165/94 |

FOREIGN PATENT DOCUMENTS

| | | |
|---|---|---|
| JP | 2000-228473 A | 8/2000 |
| KR | 2001-0009449 A | 2/2001 |

* cited by examiner

*Primary Examiner* — Leonard R Leo
(74) *Attorney, Agent, or Firm* — Sughrue Mion, PLLC

(57) ABSTRACT

A radiator fin of a heat sink has a shape of a portion of a circle with a small radius which is not overlapped with a circle with a large radius when two circles with different radiuses are overlapped with each other such that centers of the two circles are in a single circle, as a cross sectional shape. An arrangement of radiator fins of a heat sink on a radiator plate, includes at least two radiator fins provides to at least one radiator plate such that centers of inner and outer arcs of circles forming the radiator fins are on a reference line, and an outer arc of one of two adjacent radiator fins moves within a track of an inner arc of the other radiator fin or an inner arc of one radiator fin moves out of a track of an outer arc of the other radiator fin.

17 Claims, 5 Drawing Sheets

INSTALLATION FINS AND INSTALLATION STRUCTURE OF FINS AND A HEAT SINK WITH MOVING FINS INSERTED BETWEEN COOLING FINS

TECHNICAL FIELD

The present invention relates to radiator fins, an arrangement of the radiator fins, and a heat sink in which movable fins are inserted between fixed radiator fins, and more particularly, to a heat sink in which crooked plate type radiator fins are arranged to be overlap each other by a predetermined distance and air flow caused by the crooked fins cools heating body.

BACKGROUND ART

Generally, since a large scale integrated circuit, a resistor, a transistor, or a diode generates a lot of heat during the operation, the components normally operate only when the heat must be radiated to maintain under a predetermined temperature. Particularly, in a case of an electronic device generating a great deal of heat, if heat is not radiated, the device is broken due to overheat. Thus, the heat must be radiated.

A conventional radiator plate is concentrated to maximize a surface so as to increase radiating effect. As a result, a heat sink must be designed to minimize thickness and to increase surface area.

Korean Unexamined Patent Application Publication No. 2004-0078809 discloses a heat sink including a heat pipe for transferring heat of a heat absorbing unit and for emitting the heat to the exterior so that the heat sink has a fin structure with broad surface area. However, due to the increased surface area, efficiency of using space may be deteriorated.

Moreover, although a cooling fan is used in order to increase radiation efficiency, the cooling fan generates noise.

Because of the above-mentioned problem, Korean Unexamined Patent Application Publication No. 2004-0084618 discloses vibrating fins using an electromagnet instead of the cooling fan. However, the heated air is not easily cooled by the vibration of the vibration fins and the cooling effect must be insignificant.

DISCLOSURE OF INVENTION

Technical Problem

Therefore, the present invention has been made in view of the above problems, and it is an aspect of the present invention to provide a radiator fin having flexures capable of using air flow so that efficiency of the radiator fin used in cooling a heat body is increased.

It is another aspect of the present invention to provide an arrangement in which a plurality of radiator fins, which have a shape formed by overlapping two circles of difference diameters, are arranged on a radiator plate to make an air flow.

It is still another aspect of the present invention to provide a heat sink in which a rotating radiator fin is placed between a plurality of fixed radiator fins and the rotating radiator fin is moved so that a cooling fan does not need, it is convenient to use a space, and a movable structure is inserted between the fins.

It is still another aspect of the present invention to provide a heat sink in which a movable structure is inserted between radiator fins and a driving device using a motor for increasing efficiency of air flow caused by a precise rotational movement of a rotating radiator fin can be connected to rotation shafts.

Technical Solution

In accordance with an aspect of the present invention, the above and other objects can be accomplished by the provision of a radiator fin of a heat sink having a shape of a portion of a circle with a small radius which is not overlapped with a circle with a large radius when two circles with different radiuses are overlapped with each other such that centers of the two circles are in a single circle, as a cross sectional shape.

Preferably, the radiator fins may be cubes having a shape of a part which is not contained in the intersection between the small circle and the large circle.

In accordance with an aspect of the present invention, the above and other objects can be accomplished by the provision of an arrangement of radiator fins of a heat sink on a radiator plate, comprising at least two radiator fins provided to at least one radiator plate such that centers of inner and outer arcs of circles forming the radiator fins are on a reference line, and an outer arc of one of two adjacent radiator fins moves within a track of an inner arc of the other radiator fin or an inner arc of one radiator fin moves out of a track of an outer arc of the other radiator fin Moreover, there are at least three radiator fins provided to at least one radiator plate such that centers of circles forming the radiator fins are on the reference line, and an outer arc of an intermediate radiator fin of three adjacent radiator fins moves within a track of an inner arc of one of other radiator fins and an inner arc of the intermediate radiator fin moves out of a track of an outer arc of another radiator fin.

The at least three radiator fins are provided to the at least one radiator plate such that a movement distance, in which a thickness of the intermediate radiator fin is subtracted from a fin distance between radiator fins at the sides of the intermediate radiator fin, is set to as a diameter, the intermediate radiator fin maintains a close gap from one of other radiator fins, and rotation of the intermediate radiator fin at one point on the reference line is performed when the one point is on a circumference of a rotation circle with the movement distance as a diameter.

Preferably, the radiator fins provided to the radiator plate have an identical shape.

In accordance with another aspect of the present invention, the above and other objects can be accomplished by the provision of a heat sink having a movable structure inserted into a space between radiator fins, comprising: the radiator fins; a radiator plate; a fixed heat sink including a fixed panel attached to a substrate in which several fixed radiator fins are arranged by a predetermined interval and a heating body for generating heat is installed, and to radiate heat; a rotation heat sink including a rotation panel in which several curved plate type rotating radiator fins are provided between respective two of the several adjacent fixed radiator fins; a rotation unit including linkages fixed to sides of the rotation panel and rotation shafts coupled with the linkages to rotate the linkages; and a driving device including a motor for transmitting a rotation force to the rotation shafts such that air is introduced and discharged between and the fixed radiator fins and the rotating radiator fins due to rotations of the rotation unit and the rotation heat sink.

Moreover, the fixed radiator fin or the rotating radiator fin has a shape of a portion of a circle with a small radius which is not overlapped with a circle with a large radius when two circles with different radiuses are overlapped with each other such that centers of the two circles are in a single circle, as a cross sectional shape.

The rotating radiator fins have the same shape as that of the fixed radiator fins.

Moreover, the rotation shafts are positioned on the centers of rotation on the reference line and comprise grooves formed in the upper ends, and the heat sink further comprises a rotation unit which is integrally formed with the rotation shafts spaces apart from centers of the grooves by an eccentric distance and the rotation panel or provided to the rotation panel, and which comprises fixed protrusions coupled with the grooves so that the driving device moves the rotation heat sink coupled with the linkages due to rotation force generated by the driving device.

Moreover, center of the inner circle and the outer circle are on a reference line, and a movement distance which thickness is subtracted from a pin distance between adjacent two fixed pins about the reference line is twice the eccentric distance.

The driving device comprises: the motor provided to the substrate; several pulleys connected to at least two rotation shafts; and a belt to transmit a driving force of the motor as a rotation force.

Moreover, the rotation heat sink is configured such that several rotating radiator fins are integrally formed with the rotation panel.

The fixed heat sink is configured such that several fixed radiator fins are integrally formed with the fixed panel.

The fixed radiator fins and the fixed panel of the fixed heat sink are made of a material of high thermal conductivity.

Moreover, the rotation pins and the rotation panel may be made of synthetic resin of a light mass or metal of light mass.

Advantageous Effects

As described above, according to the present invention, since air flow is used but the cooling fan is not used, noise can be remarkably reduced during the operation of the heat sink.

Since the cooling fan is not used, volume of the heat sink is reduced so that space can be easily utilized.

Moreover, the heat sink is easily manufactured by designing the fixed radiator fins and the rotating radiator fins by overlapping two circles to form the shapes of the flexural fixed radiator fins and the flexural rotating radiator fins for generating the air flow.

DESCRIPTION OF REFERENCE NUMERALS FOR MAIN COMPONENTS OF THE DRAWINGS

R1: center of large circle R2: center of small circle
201: large circle 202: small circle
100: substrate 110: heating body
200: uncontained portion 300: radiator fins
350: one point 360: rotation circle
400: radiator plate 10: reference line
20: fixed heat sink 21: fixed radiator fins
23: fin distance 25: fixed panel
30: rotation heat sink 31: rotating radiator fins
35: rotation panel 34: thickness
37: movement distance 40: rotation unit
41: linkage 43: rotation shaft
44: center of rotation 45: groove
42: fixing protrusion 47: eccentric distance
46: center of groove 50: driving device
51: motor 53: pulley
54: belt Best Mode for Carrying Out the Invention Hereinafter, the embodiments of the present invention will be described in detail with reference to the accompanying drawings. Firstly, in the drawing, it should be noticed that same reference numerals are assigned to same components and parts. In the following description of the present invention, if the detailed description of the already known structure and operation may confuse the subject matter of the present invention, the detailed description thereof will be omitted.

Figure 1:
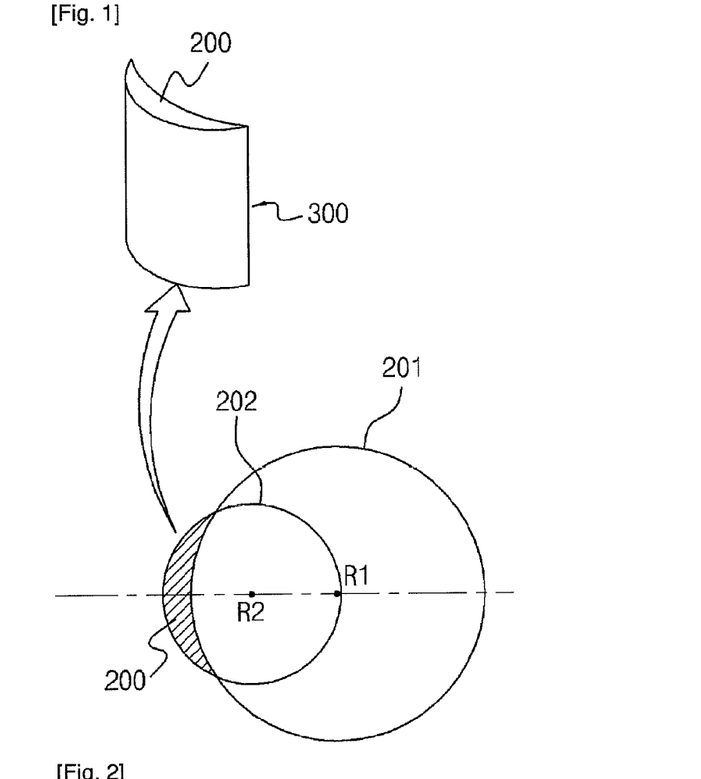
FIG. 1 is a conceptual view illustrating a design for a radiator fin according to an embodiment of the present invention.
Figure 2:
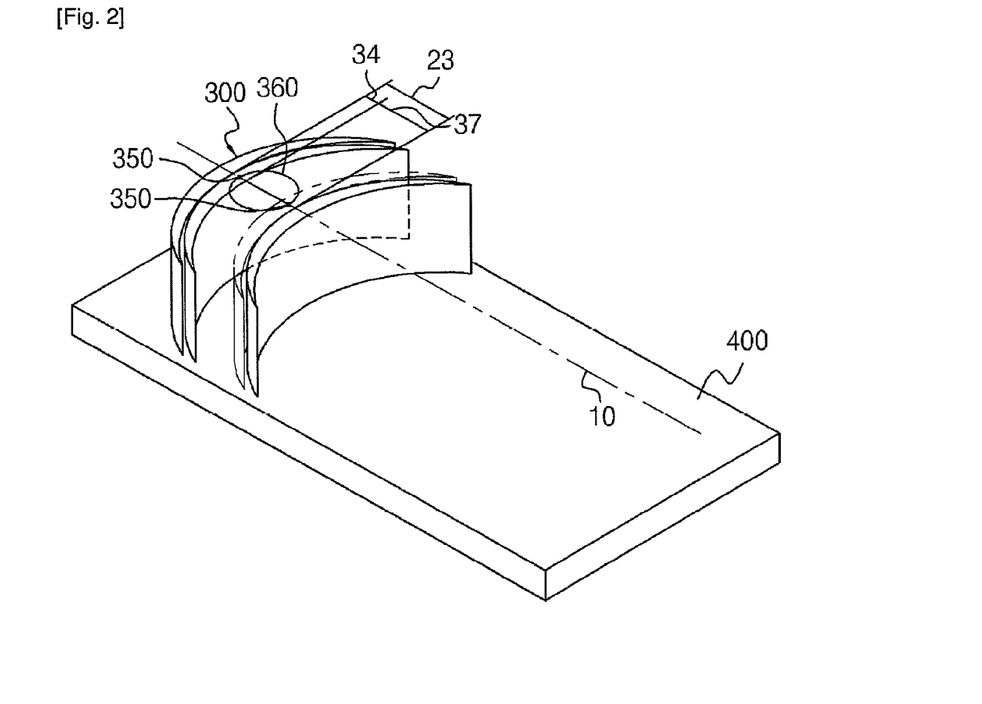
FIG. 2 is a view illustrating an arrangement of the radiator fins according to the embodiment of the present invention.

FIG. 1 is a conceptual view illustrating a design for a radiator fin according to an embodiment of the present invention, and FIG. 2 is a view illustrating an arrangement of the radiator fins according to the embodiment of the present invention.

Firstly, a circle with a certain radius and a center R1 is drawn and then is overlapped with another circle with a difference radius and a center R2. In this case, the centers of the two circles are within a single circle such that a center of a large circle 201 is set to R1, a center of a small circle 202 is set to R1, and a shape of uncontained portion 200, which is not an intersection between the two circles when the small circle having a small radius is overlapped with the large circle, is set to a cross-sectional shape of a radiator fin 300.

In this case, preferably, the uncontained portion f the small circle 202, which is not the intersection, can be adopted as the sectional shape of the radiator fin 300, and the radiator fin 300 is fabricated in the form of a cube implementing the uncontained portion 200 into a three-dimensional body.

This design for the shape of the radiator fin 300 is oriented to increase heat transferring surface, to arrange several radiator fins 300 to lead an air flow caused by movement between the radiator fins 300, and to form a streamline structure reducing resistance.

In the arrangement of the radiator fins 300, several radiator fins 300 are placed by a predetermined interval to position centers of circles forming the radiator fins 300 on a reference line. Preferably, the several radiator fins 300 have same shape and size, and hereinafter, preferred embodiment of the present invention will be described under the consumption that the radiator fins 300 have an identical shape.

When the several radiator fins 300 are arranged in a direction, a region where at least two adjacent radiator fins 300 can interactively move is a range where a region, where an outer arc of one radiator fin 300 extends to form a complete circle by an imaginary line, is not overlapped with a range, where an inner arc of another radiator fin 300 extends to form a complete circle by an imaginary line.

When at least three radiator fins 330 are arranged, a movement range of a radiator fin 300 in the middle of the three radiator fins 300 is determined within a region between a region where an outer arc of one radiator fin 300, adjacent to an inner arc of the radiator fin 300 disposed in the middle of the three radiator fins 300, is extended to form a complete circle by an imaginary line and a region where an inner arc of another radiator fin 300 is extended to form a complete circle by an imaginary line.

In a case of arranging at least three radiator fins 300, preferably, two fixed radiator fins 300 are positioned by a predetermined distance, i.e., a fin distance and one radiator fin 300 is disposed therebetween such that the radiator fin 300 disposed in the middle of the radiator fins 300 moves between the two radiator fins 300 and the fin distance may be a distance from an inner arc of one of the fixed radiator fins 300 to an outer arc of the other of the fixed radiator fins 300.

The radiator fins 300 have a predetermined thickness and a movement distance is defined by a distance where the thickness is subtracted from the fin distance.

In this case, if the radiator fin 300 disposed in the middle of the radiator fins 300 is called to as an intermediate radiator fin 300, a case when the intermediate radiator fin 300 contacts any one of another radiator fins 300 while maintaining maintains a close gap therefrom is set to as a reference state.

When a rotation circle 360 having the movement distance as a diameter is drawn on the reference line about one point 350 on the intermediate radiator fin 300 positioned on the reference line and it is assumed that the one point 350 moves along a track formed on the circumference of the rotation circle, the embodiment of the present invention can be described.

In this case, the intermediate radiator fin 300 is supported not by the rotation circle 360 having the fixed radiator fin 300 but other rotation circle 360 or other supporting member and is connected to a driving device including a motor for transmitting a rotation force to the intermediate radiator fin 300.

Figure 3:
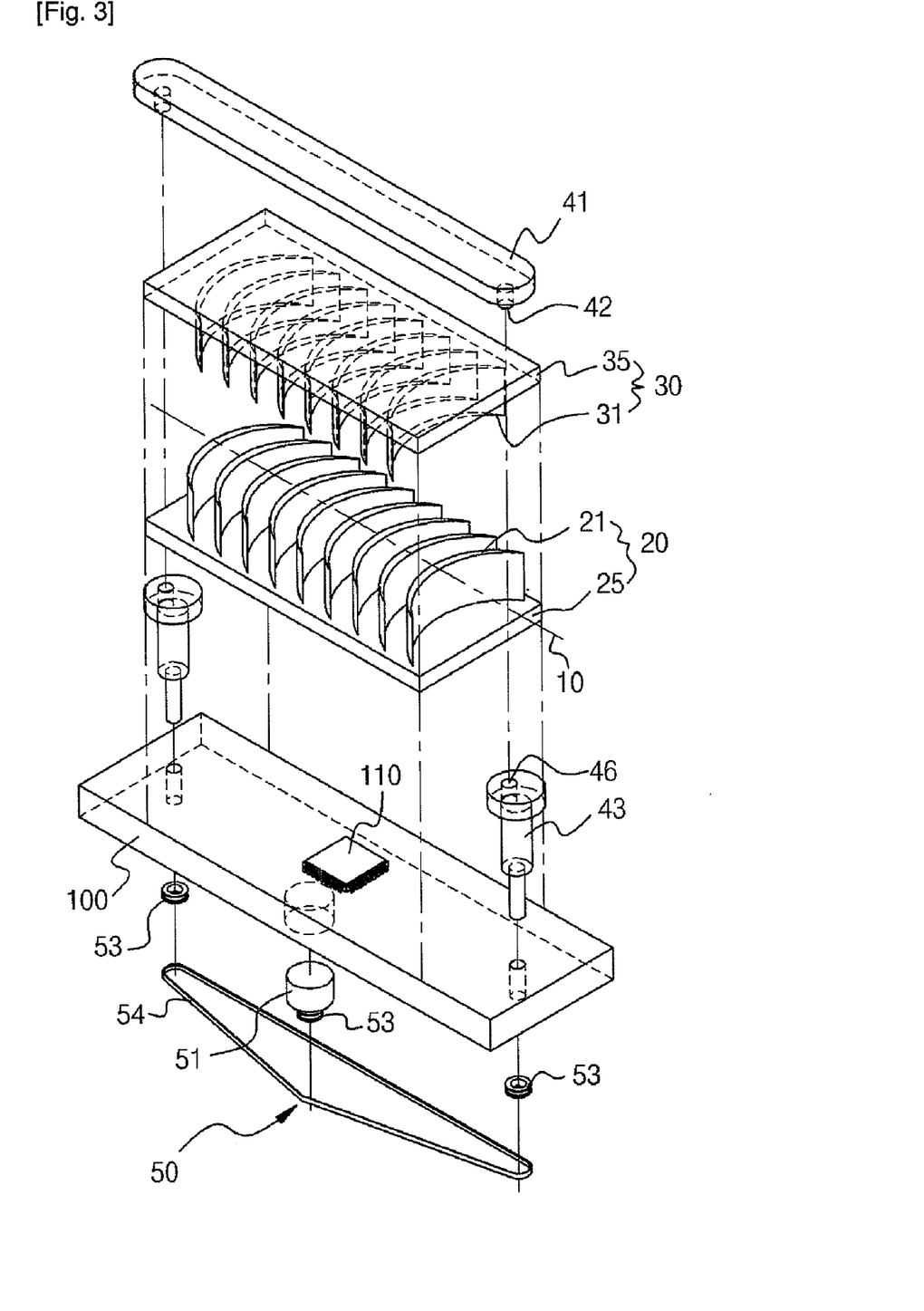
FIG. 3 is an exploded perspective view illustrating a heat sink according to an embodiment of the present invention.
Figure 4:
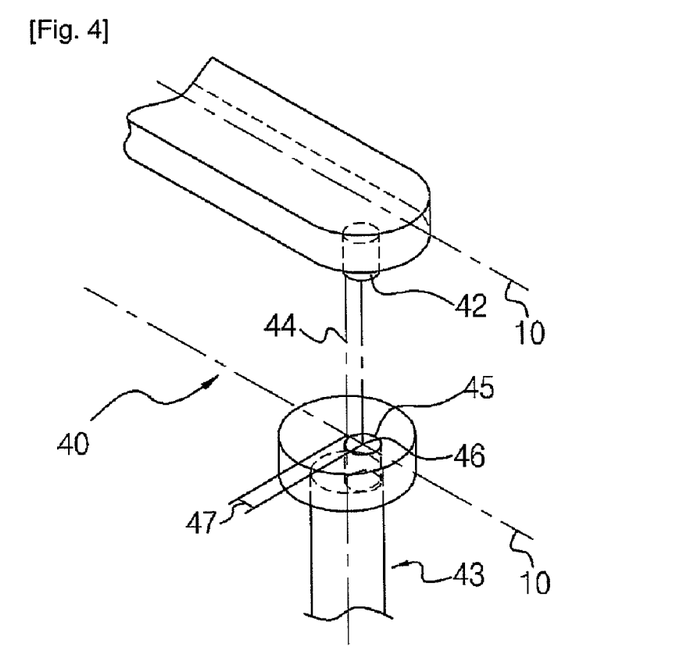
FIG. 4 is a detail view illustrating a rotation unit of the heat sink according to the embodiment of the present invention.
Figure 5:
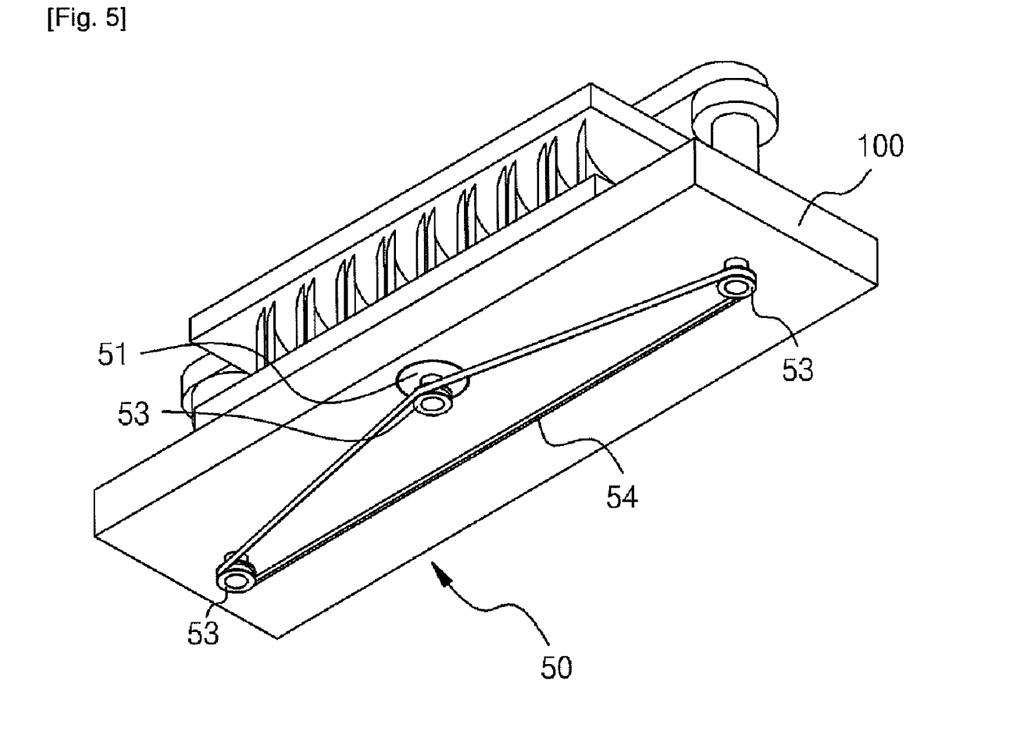
FIG. 5 is a perspective view illustrating a bottom of the heat sink according to the embodiment of the present invention.

FIG. 3 is an exploded perspective view illustrating a heat sink according to an embodiment of the present invention, FIG. 4 is a detail view illustrating a rotation unit of the heat sink according to the embodiment of the present invention, and FIG. 5 is a perspective view illustrating a bottom of the heat sink according to the embodiment of the present invention.

In this embodiment of the present invention, a fixed heat sink 20, a rotation heat sink 30, and a rotation unit 40 to rotate the rotation heat sink 30 are provided on a substrate 100 to which a heating body 110 for generating heat is attached, and the rotation unit 40 is driven by a driving device 50 including a motor 51.

The heating body 110 and the substrate 100 may be a central processing unit (CPU) of an electronic device such as a laptop computer, a desktop computer, a server, a liquid crystal display (LCD), or a plasma display panel (PDP), or a circuit board 100 in which electronic component such as a thermoelectric device, a video graphic array (VGA) card, a power transistor is mounted.

The fixed heat sink 20 implemented by a fixed panel having fixed radiator fins 21 is positioned on the heating body 110 of the substrate 100. The fixed radiator fins 21 are curved thin metal plates and made of copper having high thermal conductivity.

Preferably, the fixed radiator fins 21 may be thin plates having a cross sectional shape in the form of a crescent shape formed by which two circles intersect each other when the two circles with different radiuses are drawn taking a virtual reference line 10 as centers of the circles.

These several fixed radiator fins 21 are provided to a fixed panel 25 by a pre-determined interval, and in this case, the fixed radiator fins 21 may be integrally formed with the fixed panel 25.

Like in the fixed radiator fins 21, in order for effective heating operation, the fixed panel 25 is made of material of high thermal conductivity such as any one of copper and aluminum, or an alloy thereof.

A shape of rotation radiator fins may be preferably identical to the shape of the fixed radiator fins 21 or the crescent shape formed by which two circles intersect each other when the two circles of different radiuses are drawn by taking the reference line 10 as centers of the circles. In this case, the rotating radiator fins 31 are made of synthetic resin with a light weight or a thin metal with light weight and high thermal conductivity.

The rotating radiator fins 31 are positioned between two adjacent fixed radiator fins 21 of the several fixed radiator fins 21, and upper ends of several rotating radiator fins 31 are provided to a rotating panel 35 to form the rotation heat sink 30. The rotation panel 35 may be made of synthetic resin with light weight or a metal thin film.

The rotation unit 40 is coupled with the rotation panel 35 of the rotation heat sink 30, and the rotation unit 40 includes linkages 41 and rotation shafts 43.

The linkages 41 are integrally formed with the rotation panel 35 or are attached to the rotation panel 35, and include fixed protrusions 42 downwardly protruding from the lateral sides of the linkages 41.

The rotation shafts 43 have centers of rotation 44 positioned on the reference line 10 and grooves 45 formed in the upper ends and with which the fixed protrusions 42 are coupled.

The grooves 45 have centers 46 positioned on the reference line 10 and centers of gravity (not shown) of the fixed protrusions 42 are positioned at the centers of the grooves 46 so that the fixed protrusions 42 can be coupled with the grooves 45. In this case, it can be assumed that distances between the centers of rotation 44 and the centers of the grooves 46 are eccentric distances. The eccentric distances will be described in the principle of operation of the present invention with reference to FIGS. 5 and 6.

The rotation shafts 43 are coupled with the linkages 41 in the upper direction and penetrate penetrating holes (not shown) of the substrate 100 in the down direction to be coupled with the driving device 50 including the motor 51 or are directly connected to the driving device 50 as the motor 51.

The driving device 50 including the motor 51 is directly connected to the rotation shafts 43 or includes, in a case of including at least two rotation shafts 43, several pulleys 53 and a belt 54 for transmitting a driving force of the motor 51 as a rotation force.

In this case, the belt 54 is preferably a timing belt 54 in order to transmit identical rotation force to the respective rotation shafts 43.

The motor 51 is positioned on the rear side where is spaced apart from the place where the heating body 110 of the substrate 100 is provided and heat from the motor 51 is not transferred to the heating body 110, or is directly attached to the substrate 100 or other supporting body.

Figure 6:
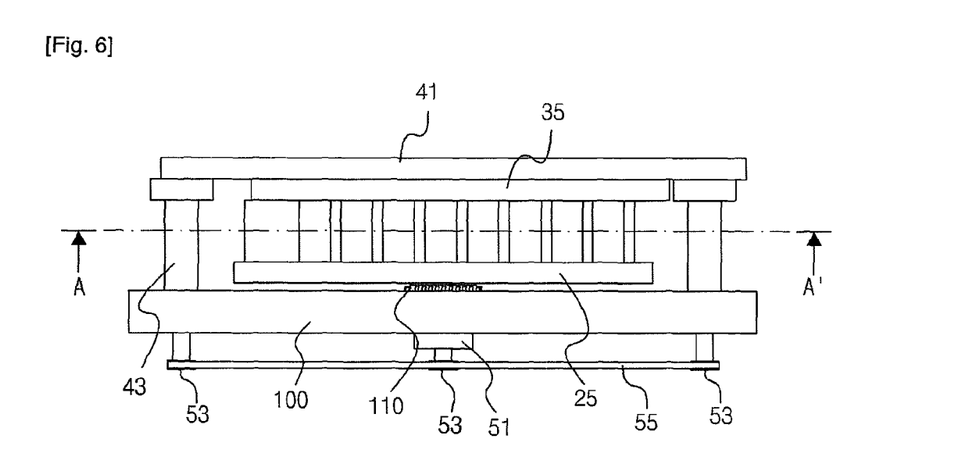
FIG. 6 is an elevation view illustrating the heat sink according to the embodiment of the present invention.
Figure 7:
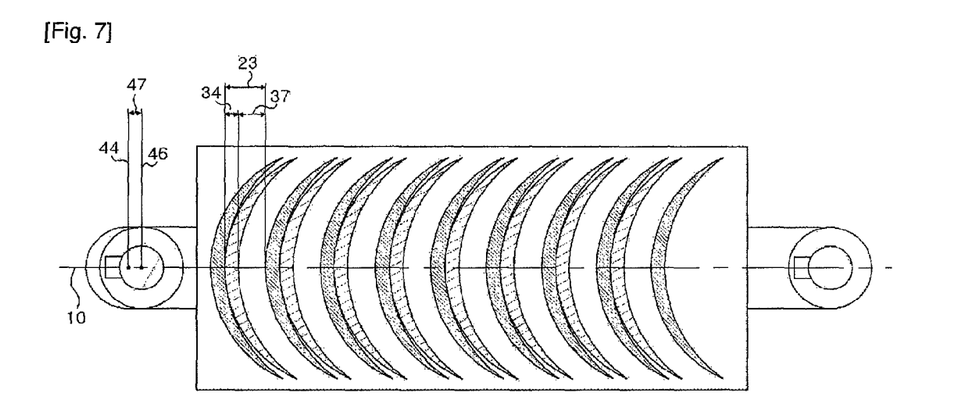
FIG. 7 is a plan view illustrating a movement distance and an eccentric distance of the heat sink according to the embodiment of the present invention when viewing a section taken along the line A-A from the elevation view.
Figure 8:
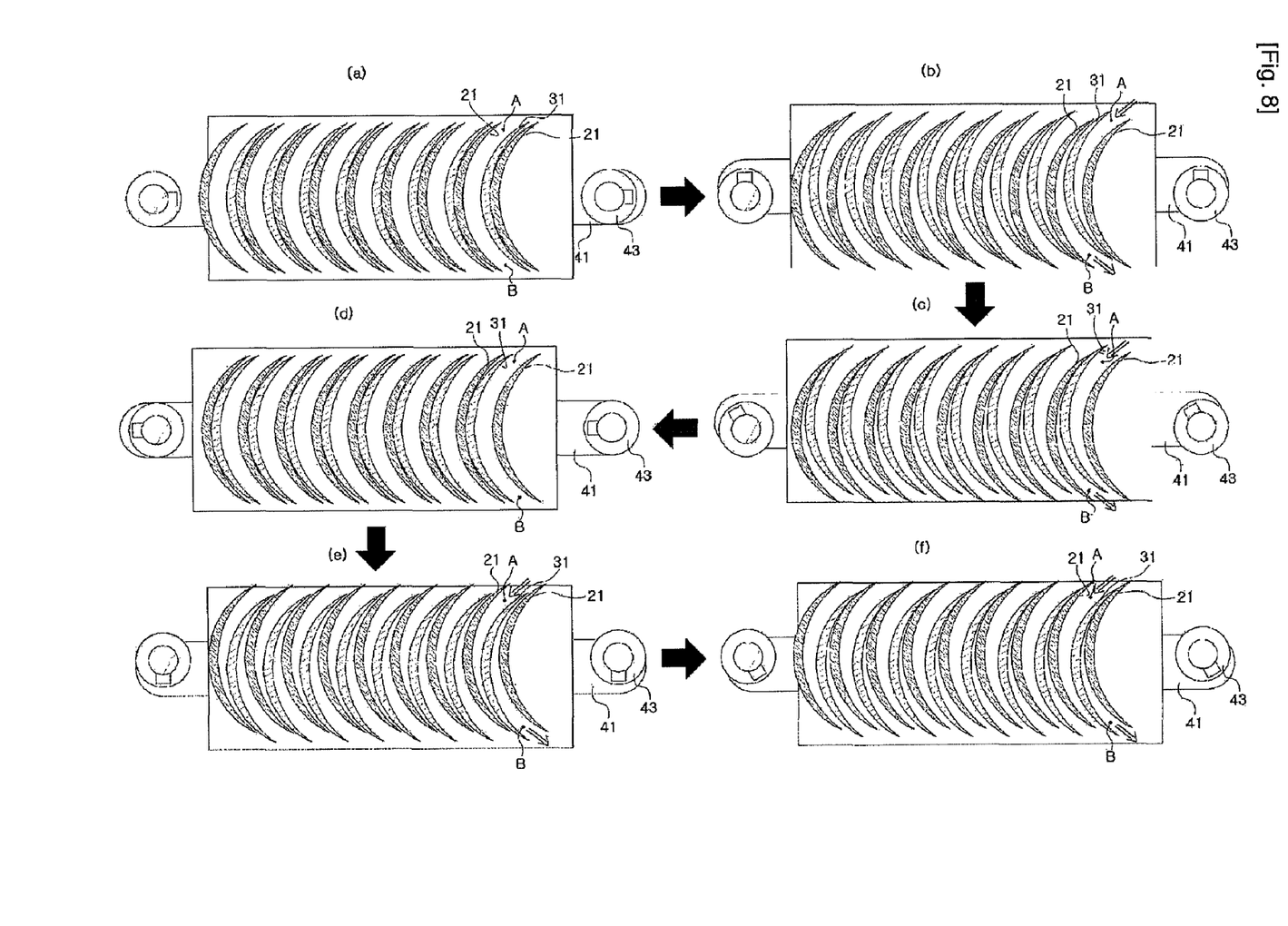
FIG. 8 is a view illustrating operation of the fixed radiator fins and the rotating radiator fins according to the embodiment of the present invention when viewing the section taken along the line A-A from the elevation view.

FIG. 6 is an elevation view illustrating the heat sink according to the embodiment of the present invention, FIG. 7 is a plan view illustrating a movement distance and an eccentric distance of the heat sink according to the embodiment of the present invention when viewing a section taken along the line A-A from the elevation view, and FIG. 8 is a view illustrating operation of the fixed radiator fins and the rotating radiator fins according to the embodiment of the present invention when viewing the section taken along the line A-A from the elevation view. The principle of operation of the heat sink according to the embodiment of the present invention will be described.

A reference numeral 10 is assigned to the reference line 10. The fixed radiator fins 21, the rotating radiator fins 31, and the rotation shafts 43 can be designed about the reference line 10. The fixed radiator fins 21 may be curved plate type fins having a cross section such as a crescent shape formed by intersecting two circles of different radiuses on the reference line 10 and preferably the rotating radiator fins 31 may have the same shape as that of the fixed radiator fins 21 for the convenience of design. It is assumed that the fixed radiator fins 21 and the rotating radiator fins 31 have a cross section formed by an outer arc of a large radius of curvature and an inner arc of a small radius of curvature for the convenience. A distance between an inner arc and an outer arc of the fixed radiator fin 21 or the rotating radiator fin 31 on the reference line 10 is set to as thickness 34. A distance between two fixed radiator fins 21 or two rotating radiator fins 31 in the fixed radiator fins 21 or the rotating radiator fins 31 which are arranged by a pre-determined interval, that is, a distance from an inner arc of one fixed radiator fin 21 on the reference line 10 to an outer arc of another adjacent fixed radiator fin 21, or a distance from an inner arc of one rotating radiator fin 31 on the reference line 10 to an outer arc of another adjacent rotating radiator fin 31 is set to as a fin distance 23. In this case, a movement distance 37 is set to as a distance where the thickness 34 is subtracted from the fin distance 23.

When the rotating radiator fins 31 move between respective two adjacent fixed radiator fins 21, the rotation shafts 43 transmit the driving force of the driving device 50 including the motor 51 and start to rotate about the centers of rotation 44 in a pre-determined direction at the same revolution per minute as that of the motor 51.

In this case, the fixed protrusions 42 of the linkages 42 are fixed in the grooves 45 in which the centers 46 of the grooves are spaces apart from the centers of rotation 44 by the eccentric distances so that the linkages 41 start to a circular movement with a radius, i.e., the eccentric distances from the centers of rotation 44 to the centers of groove 46 about the centers of grooves 44 due to the rotation of the rotation shafts 43.

Since the linkages 41 are formed in the rotation heat sink 30 or are fixed to the rear side of the rotation panel 35 having the rotating radiator fins 31, the several rotating radiator fins 31 of the rotation heat sink 30 individually rotate. Hereinafter, the movement of the rotating radiator fins 31 will be described, and the movement distance must be twice the eccentric distance in a relationship between the eccentric distances and the movement distance 37.

A reference state of the movement state of the rotating radiator fins 31 and the fixed radiator fins 21 is set to as a state illustrated in FIG. 8A. A rotation direction may be clockwise direction or counterclockwise direction, preferably is set to as the counterclockwise direction in this embodiment of the present invention. Moreover, as an embodiment of the present invention, an air flow will be described with respect to a position A and a position B in FIG. 8.

The reference state where nothing of movement is, as illustrated in FIG. 8A, is assumed as a state where air does not flow, and the rotating radiator fins 31 maintain a close gap from the outer arcs of the fixed radiator fins 21.

The close gap means a state where the rotating radiator fins 31 do not contact the fixed radiator fins 21 in order to minimize friction. In a case when the rotating radiator fins 31 rotate and generate frictional heat due to friction against the fixed radiator fins 21, the rotating radiator fins 31 may be made of aluminum or copper with high thermal conductivity.

As illustrated in FIG. 8B, the centers of grooves 46 rotate by 90 degrees about the centers of rotation 44 due to the rotation so that air is introduced into the point A and is discharged through the point B. The outer arcs of the rotating radiator fins 31 move while maintaining the close gap along the tracks of the inner arcs of the fixed radiator fins 21. FIG. 8C illustrates air is continuously introduced into the point A and is continuously discharged through the point B.

After that, as illustrated in FIG. 8D, the rotation is performed by 180 degrees so that the outer arcs of the rotating radiator fins 31 maintain the close gap against the inner arcs of the fixed radiator fins 21.

After that, as illustrated in FIGS. 8E and 8F, the air may be introduced into the point A and is discharged through the point B due to the rotation of the rotating radiator fins 31.

Heat generated from the heating body 110 mounted to the substrate 100 can be discharged due to the high speed rotation of the rotating radiator fins 31, and exothermic operation of the fixed radiator fins 21 can be cooled by accelerating the air flow due to the rotation of the rotating radiator fins 31.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A heat sink having a movable structure inserted into a space between radiator fins, comprising:
    the radiator fins;
    a radiator plate;
    a fixed heat sink including a fixed panel attached to a substrate in which several fixed radiator fins are arranged by a predetermined interval and a heating body for generating heat is installed, and to radiate heat;
    a rotation heat sink including a rotation panel in which several curved plate type rotating radiator fins are provided between respective two of the several adjacent fixed radiator fins;
    a rotation unit including linkages fixed to sides of the rotation panel and rotation shafts coupled with the linkages to rotate the linkages; and
    a driving device including a motor for transmitting a rotation force to the rotation shafts such that air is introduced and discharged between and the fixed radiator fins and the rotating radiator fins due to rotations of the rotation unit and the rotation heat sink.

2. The heat sink having a movable structure inserted into a space between radiator fins according to claim 1, wherein the rotating radiator fins have the same shape as that of the fixed radiator fins.

3. The heat sink having a movable structure inserted into a space between radiator fins according to claim 2, wherein the rotation heat sink is configured such that several rotating radiator fins are integrally formed with the rotation panel.

4. The heat sink having a movable structure inserted into a space between radiator fins according to claim 2, wherein the fixed heat sink is configured such that several fixed radiator fins are integrally formed with the fixed panel.

5. The heat sink having a movable structure inserted into a space between radiator fins according to claim 2, wherein the fixed radiator fins and the fixed panel of the fixed heat sink are made of aluminum or copper.

6. The heat sink having a movable structure inserted into a space between radiator fins according to claim 1, wherein the rotation shafts are positioned on the centers of rotation on the reference line and comprise grooves formed in the upper ends, and the heat sink further comprising a rotation unit which is integrally formed with the rotation shafts spaces apart from centers of the grooves by an eccentric distance and the rotation panel or provided to the rotation panel, and which comprises fixed protrusions coupled with the grooves so that the driving device moves the rotation heat sink coupled with the linkages due to rotation force generated by the driving device.

7. The heat sink having a movable structure inserted into a space between radiator fins according to claim 6, wherein the rotation heat sink is configured such that several rotating radiator fins are integrally formed with the rotation panel.

8. The heat sink having a movable structure inserted into a space between radiator fins according to claim 6, wherein the fixed heat sink is configured such that several fixed radiator fins are integrally formed with the fixed panel.

9. The heat sink having a movable structure inserted into a space between radiator fins according to claim 6, wherein the fixed radiator fins and the fixed panel of the fixed heat sink are made of aluminum or copper.

10. The heat sink having a movable structure inserted into a space between radiator fins according to claim 6, wherein the eccentric distance is a half of a movement distance in which a thickness of the rotating radiator fins is subtracted from a fin distance between two adjacent fixed radiator fins.

11. The heat sink having a movable structure inserted into a space between radiator fins according to claim 10, wherein the rotation heat sink is configured such that several rotating radiator fins are integrally formed with the rotation panel.

12. The heat sink having a movable structure inserted into a space between radiator fins according to claim 10, wherein the fixed heat sink is configured such that several fixed radiator fins are integrally formed with the fixed panel.

13. The heat sink having a movable structure inserted into a space between radiator fins according to claim 10, wherein the fixed radiator fins and the fixed panel of the fixed heat sink are made of aluminum or copper.

14. The heat sink having a movable structure inserted into a space between radiator fins according to claim 1, wherein the driving device comprises:
   the motor provided to the substrate;
   several pulleys connected to at least two rotation shafts; and
   a belt to transmit a driving force of the motor as a rotation force.

15. The heat sink having a movable structure inserted into a space between radiator fins according to claim 1, wherein the rotation heat sink is configured such that several rotating radiator fins are integrally formed with the rotation panel.

16. The heat sink having a movable structure inserted into a space between radiator fins according to claim 1, wherein the fixed heat sink is configured such that several fixed radiator fins are integrally formed with the fixed panel.

17. The heat sink having a movable structure inserted into a space between radiator fins according to claim 1, wherein the fixed radiator fins and the fixed panel of the fixed heat sink are made of aluminum or copper.

* * * * *